(12) United States Patent
Okuno et al.

(10) Patent No.: US 7,354,481 B2
(45) Date of Patent: Apr. 8, 2008

(54) SUBSTRATE HOLDING AND ROTATING APPARATUS

(75) Inventors: Eiji Okuno, Kyoto (JP); Takeshi Yoshida, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 268 days.

(21) Appl. No.: 11/197,210

(22) Filed: Aug. 3, 2005

(65) Prior Publication Data
US 2006/0054082 A1 Mar. 16, 2006

(30) Foreign Application Priority Data
Sep. 14, 2004 (JP) .............................. 2004-267332

(51) Int. Cl.
*B05C 13/00* (2006.01)
(52) U.S. Cl. ................. 118/503; 134/902; 156/345.55; 279/35; 279/106
(58) Field of Classification Search ................ 118/500, 118/503, 52, 320; 427/240; 134/148, 153, 134/902; 156/345.55; 279/33, 35, 106, 279/109; 396/611
See application file for complete search history.

(56) References Cited
U.S. PATENT DOCUMENTS
4,788,994 A 12/1988 Shinbara ..................... 134/157

2005/0112279 A1* 5/2005 Kern, Jr. ..................... 427/240

FOREIGN PATENT DOCUMENTS
JP 63-153839 6/1988
JP 2003-39007 2/2003
JP 2003-133280 5/2003

* cited by examiner

*Primary Examiner*—Laura Edwards
(74) *Attorney, Agent, or Firm*—Ostrolenk, Faber, Gerb & Soffen, LLP (57) ABSTRACT

A substrate holding and rotating apparatus includes: a spin base connected to a rotary shaft and rotatable therearound; holding members attached to the spin base and displaceable between holding positions at which the holding members come in contact with the peripheral edge of the substrate such that the holding members are capable of holding the substrate, and retreat positions at which the holding members are retreated from the holding positions; a holding members drive mechanism for driving the holding members between the holding positions and the retreat positions; and a rotation regulating mechanism arranged to be brought, in association with the operation of the holding-member drive mechanism, into a rotation allowing state where the spin base is allowed to be rotated and into a rotation regulating state where the rotation of the spin base is regulated.

3 Claims, 10 Drawing Sheets

SUBSTRATE HOLDING AND ROTATING APPARATUS

BACKGROUND OF THE INVENTION

1. Field of the Invention

The present invention relates to a substrate holding and rotating apparatus for holding and rotating a substrate. Examples of the substrate to be held include a semiconductor wafer, a liquid-crystal-display-device substrate, a plasma-display substrate, an optical-disk substrate, a magnetic-disk substrate, a photomagnetic-disk substrate, a photomask substrate and the like.

2. Description of Related Art

For example, in a semiconductor device production line, there is used a substrate processing apparatus for processing a substrate with a treating liquid. Examples of the substrate processing apparatus include a batch-type apparatus in which a plurality of substrates are collectively processed as immersed in a treating liquid and a sheet-feed type apparatus in which substrates are processed one by one. A substrate processing apparatus of the sheet-feed type has, for example, a spin chuck for rotating a substrate as substantially horizontally held and a treating liquid nozzle for supplying a treating liquid to a substrate which is under rotation as held by the spin chuck.

The spin chuck has a rotary shaft disposed in a perpendicular direction, a spin base substantially horizontally attached to the upper end of the rotary shaft, a plurality of chuck pins attached to the spin base, and an interlocking link mechanism for interlocking the opening/closing operations of the plurality of chuck pins (See Japanese Patent Laid-Open Publication No. 2003-39007). The plurality of chuck pins are displaceable between holding positions where the chuck pins come in contact with the peripheral edge portion of the substrate, and retreat positions where the chuck pins retreat outwardly from the holding positions. The interlocking link mechanism is connected to a coiled spring for biasing the chuck pins to the holding positions, and has a release lever for moving the chuck pins to the retreat positions against the biasing force of the coiled spring.

The spin chuck is housed in a processing cup. Disposed outside of the processing cup is a release claw for releasing the substrate holding state provided by the chuck pins. At the time of delivery of a substrate to and from the spin chuck, the release claw is operated to operate the release lever to release the substrate holding state provided by the chuck pins.

More specifically, after moved to a position in the vicinity of the spin chuck from the standby position outside of the processing cup, the release claw actuates the release lever to release the holding of the substrate by the chuck pins. Under such a condition, a substrate delivery robot carries out a treated substrate from the spin chuck and carries in an untreated substrate to the spin chuck. Thereafter, the release claw is retreated, causing the substrate to be held by the chuck pins. When the release claw is further moved and returned to the standby position outside of the processing cup, the spin base starts rotating and the feed of a treating liquid also starts.

To securely actuate the release lever by the release claw, it is required to separately dispose a rotation locking mechanism for preventing the spin base from rotating before the holding of a substrate by the chuck pins is released. This disadvantageously not only complicates the arrangement but also requires more space inside of the apparatus and also makes the control complicated.

Further, the release claw has to be moved to a position in the vicinity of the spin chuck from the standby position outside of the processing cup, and thereafter to be returned to the standby position. This takes much time. Accordingly, this takes time for replacement of a substrate to be processed, resulting in reduction in the processing ability of the substrate processing apparatus. Further, before the release claw is operated, it is required not only to operate the rotation locking mechanism but also to make sure of the operation of the rotation locking mechanism. This causes the substrate processing ability to be further lowered.

SUMMARY OF THE INVENTION

It is an object of the present invention to provide a substrate holding and rotating apparatus capable of simplifying the arrangement for releasing a substrate holding state.

It is another object of the present invention to provide a substrate holding and rotating apparatus capable of shortening the time required for substrate replacement.

A substrate holding and rotating apparatus according to the present invention comprises: a spin base connected to a rotary shaft and rotatable therearound; holding members attached to the spin base and displaceable between holding positions at which the holding members come in contact with the peripheral edge of the substrate such that the holding members are capable of holding the substrate, and retreat positions at which the holding members are retreated from the holding positions; a holding-member drive mechanism for driving the holding members between the holding positions and the retreat positions; and a rotation regulating mechanism arranged to be brought, in association with the operation of the holding-member drive mechanism, into a rotation allowing state where the spin base is allowed to be rotated and into a rotation regulating state where the rotation of the spin base is regulated.

According to the above-mentioned arrangement, the rotation regulating mechanism for regulating the rotation of the spin base is arranged to be interlocked with the operation of the holding-member drive mechanism for driving the holding members. Accordingly, both regulation of the rotation of the spin base and release of the substrate holding state can be conducted in a short period of time. This shortens the time required for replacement of a substrate to be processed. Further, the regulation of the spin base rotation is in association with the release of the substrate holding state. This not only simplifies the arrangement but also lowers the cost of the apparatus and reduces the space required in the apparatus. This also simplifies the control required for replacement of a substrate to be processed.

The holding-member drive mechanism may includes: a drive source; a moving member arranged to be moved upon reception of a drive force from the drive source; and a drive force transmitting mechanism for transmitting the motion of the moving member to the holding members, and the rotation regulating mechanism may includes an engagement portion provided on the rotary shaft or the spin base; and a lock member provided on the moving member and arranged to be brought into an engagement state where the lock member is engaged with the engagement portion by the movement of the moving member and into a disengagement state where the lock member is disengaged from the engagement portion.

According to the above-mentioned arrangement, the moving member is moved by the drive force from the drive source. This not only enables the holding members to be displaced between the holding positions and the retreat positions but also enables the lock member disposed at the moving member to be engaged with or disengaged from the engagement portion. This simplifies both the arrangement and the control.

More specifically, the moving member may be movable along the rotary shaft and may have a cam follower for transmitting a drive force to the holding-member drive mechanism, and the drive force transmitting mechanism may includes: a rotary ring attached to the spin base and rotatable around the rotary shaft with respect to the spin base; link mechanisms for transmitting the rotation of the rotary ring to the holding members; and a cam member secured to the rotary ring for receiving the cam follower disposed at the moving member, thus converting the drive force transmitted from the cam follower to the rotation of the rotary ring.

According to the above-mentioned arrangement, the motion of the moving member which moves along the rotary shaft is converted into a rotational motion of the rotary ring by the cam mechanism, and the rotational motion is transmitted to the holding members through the link mechanisms. Then, the moving member is moved along the rotary shaft to cause the lock member to be engaged with and disengaged from the engagement portion. Accordingly, the rotation regulating state in which the rotation of the spin base is regulated can be switched, by a fast operation, to or from the rotation allowing state in which the rotation of the spin base is allowed.

The engagement portion of the rotation regulating mechanism may have a concave portion for receiving the lock member. More specifically, the moving member is moved along the rotary shaft, and the lock member consequently enters into or gets out of the concave portion. This enables the rotation regulating state to be switched to or from the rotation allowing state. Preferably, the concave portion has a pair of rotation regulating faces which are opposite to each other in the rotation direction with the lock member held therebetween, and also has an opening portion which allows the lock member to go in and out in the direction along the rotary shaft.

The lock member may have a pair of projections, and the engagement portion may be a projecting member to be held by and between the pair of projections. In this case, it is enough that the moving member is moved along the rotary shaft such that the pair of projections forming the lock member are brought into a state where the projecting member is engaged with the pair of projections as held therebetween and into a state where this engagement state is released. The projecting member is preferably formed as extending along the rotary shaft. Further, the projecting member preferably has outer peripheral faces serving as a pair of rotation regulating faces respectively opposite to the pair of projections in the rotation direction.

The rotation regulating mechanism may be arranged to be brought into the rotation regulating state from the rotation allowing state before the holding members are driven when the holding members are guided from the holding positions to the retreat positions by the holding-member drive mechanism, and may also be arranged to be brought into the rotation allowing state from the rotation regulating state after the driving of the holding members has been completed when the holding members are guided from the retreat positions to the holding positions by the holding-member drive mechanism.

According to the above-mentioned arrangement, when releasing the substrate holding state, the rotation of the spin base is regulated prior to the release. Further, when holding the substrate, the rotation of the spin base is allowed after the substrate holding has been completed. Accordingly, both the substrate holding operation and the substrate holding release operation can securely be conducted with the rotation of the spin base regulated.

This arrangement is particularly effective when a rotation reaction force acts on the spin base at the time the holding members are operated. More specifically, since the rotation reaction force can be received by the rotation regulating mechanism, the holding members can securely be operated to hold a substrate and to release the substrate holding state.

The foregoing and other elements, features, steps, characteristics and advantages of the present invention will become more apparent from the following detailed description of the preferred embodiments with reference to the attached drawings.

DETAILED DESCRIPTION OF PREFERRED EMBODIMENTS

Figure 1:
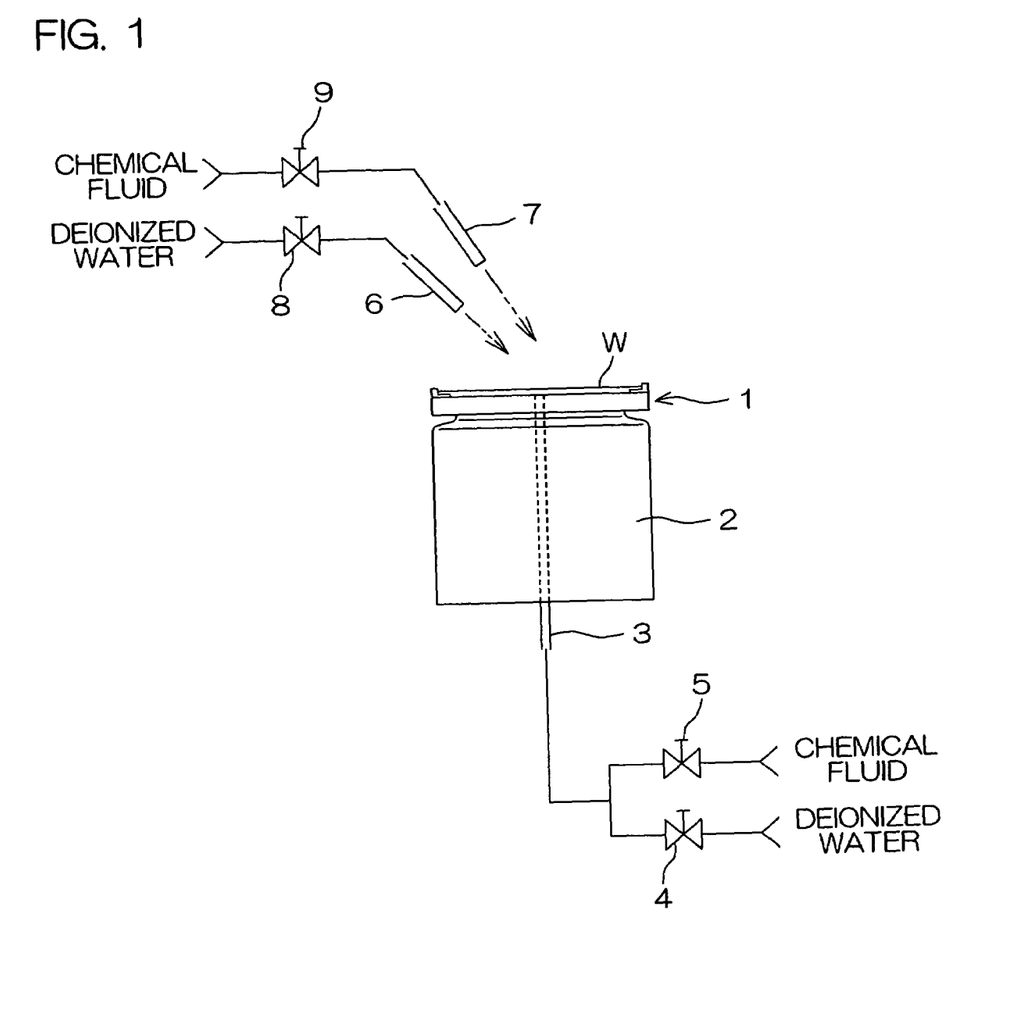
FIG. 1 is a schematic view for illustrating the arrangement of a substrate processing apparatus to which a first preferred embodiment of the present invention is applied.

FIG. 1 is a schematic view for illustrating the arrangement of a substrate processing apparatus to which a first preferred embodiment of the present invention is applied. This substrate processing apparatus is provided, in a processing cup (not shown), with a spin chuck 1 serving as a substrate holding and rotating apparatus which substantially horizontally holds a semiconductor wafer (hereinafter simply referred to as a wafer) W or a substantially circular substrate, and which is rotated around the vertical axis passing through the substantial center of the wafer W thus held.

The spin chuck 1 is arranged to be rotated as connected to the rotary shaft or drive shaft of a motor 2 serving as a rotary drive mechanism. This rotary shaft is a hollow shaft, inside of which there passes a treating liquid feed pipe 3 capable of supplying a deionized water or a chemical fluid. The treating liquid feed pipe 3 is connected to a center shaft nozzle (fixed nozzle) having a discharge port at a position in the vicinity of the center of the underside of the wafer W held by the spin chuck 1. From the discharge port of the center shaft nozzle, a deionized water or a chemical fluid (etching solution or the like) can be supplied toward the underside of the wafer W.

Provision is made such that a deionized water or an etching solution is supplied, at a predetermined timing, to the treating liquid feed pipe 3 through a deionized water valve 4 connected to a deionized water source or a chemical fluid valve 5 connected to a chemical fluid supply source.

Disposed above the spin chuck 1 are a deionized water nozzle 6 and a chemical fluid nozzle 7 for respectively supplying a deionized water and a chemical fluid (etching solution or the like) toward the top of a wafer W. Provision is made such that a deionized water is supplied to the deionized water nozzle 6 through a deionized water valve 8, and a chemical fluid is supplied to the chemical fluid nozzle 7 through a chemical fluid valve 9.

According to the above-mentioned arrangement, a treating liquid (chemical fluid or deionized water) can be supplied to at least one of the top and underside of the wafer W under rotation by the spin chuck 1.

Figure 2:
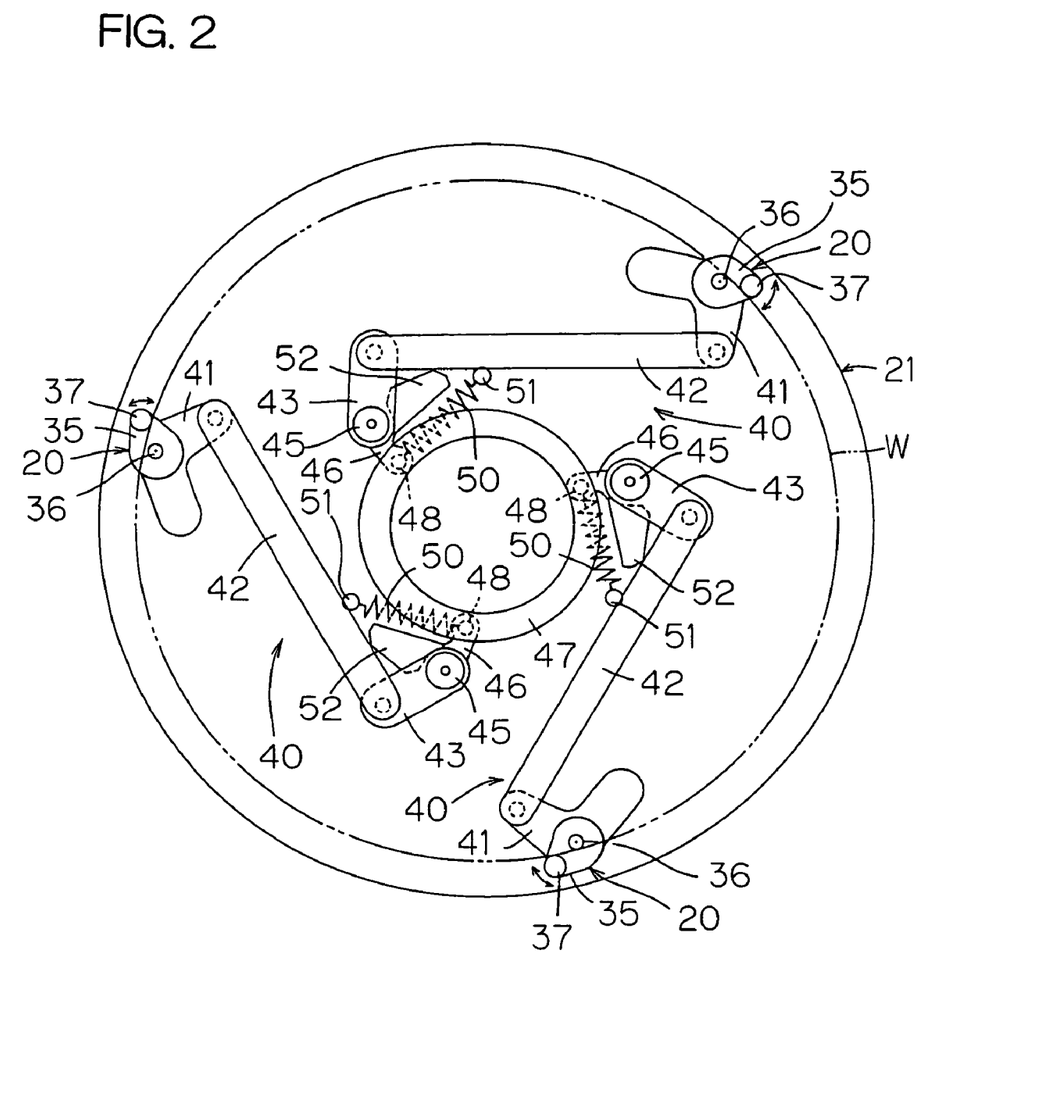
FIG. 2 is a plan view, in a perspective mode, of the internal arrangement of a spin chuck.
Figure 3:
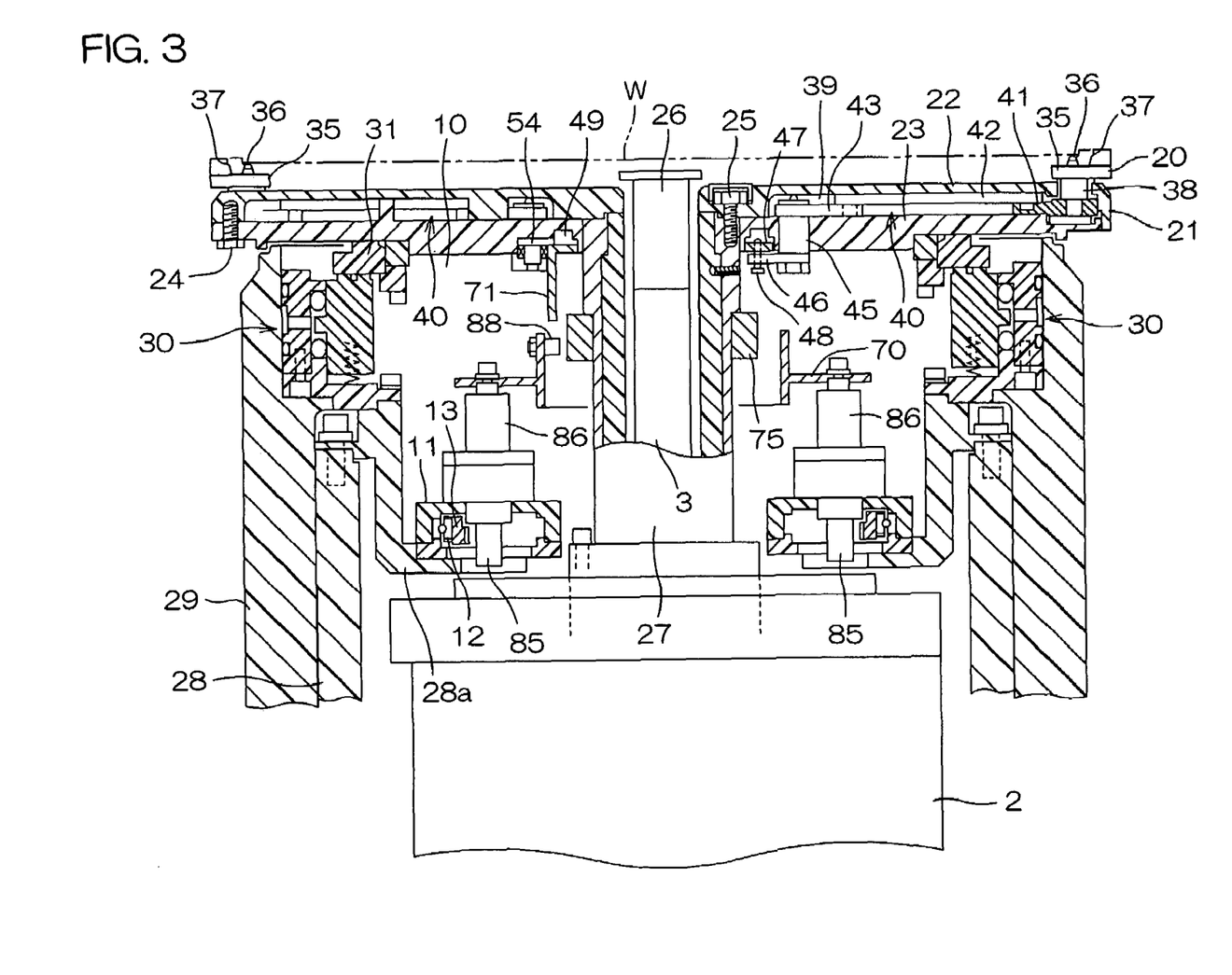
FIG. 3 is a longitudinal section view for illustrating the internal arrangement of the spin chuck.

FIG. 2 is a plan view, in a perspective mode, of the internal arrangement of the spin chuck 1, and FIG. 3 is a longitudinal section view for illustrating the internal arrangement of the spin chuck 1. The spin chuck 1 has a disk-like spinbase 21, and a plurality of (three in this embodiment) holding members 20 are disposed, at substantially regular angular intervals, on the top of the spin base 21 at its peripheral edge portion. These holding members 20 operate, in association with one another, to hold the wafer W and to release the wafer holding state. More specifically, the holding members 20 can be displaced between holding positions where the holding members 20 come in contact with the peripheral edge of the wafer W, and retreat positions where the holding members 20 retreat outwardly from the holding positions.

The spin base 21 has a disk-like upper cover 22 and a disk-like lower cover 23. The upper cover 22 and lower cover 23 are overlapped on and connected to each other with the use of bolts 24 disposed at the peripheral edge of the spin base 21 and a bolt 25 disposed at the inner part thereof.

The upper cover 22 and the lower cover 23 are provided in the centers thereof with insertion holes, through which there passes an inside nozzle 26 disposed at the tip of the treating liquid feed pipe 3.

A rotary shaft 27 in a unitary structure with the drive shaft of the motor 2 is a hollow shaft passing through the motor 2, and the treating liquid feed pipe 3 is housed inside of the rotary shaft 27. A casing 28 is disposed for surrounding the motor 2, and is surrounded by a case-like cover member 29. The upper end of the cover member 29 extends to a position in the vicinity of the underside of the spinbase 21, and a seal mechanism 30 is disposed at the inner face of the cover member 29 in the vicinity of the upper end thereof. This seal mechanism 30 comes in sliding contact with a seal member 31 fixed to the underside of the spin base 21. Accordingly, formed between the seal mechanism 30 and the rotary shaft 27 is a mechanism-unit housing space 10 which is defined by the spin base 21 and the cover member 29 and which is a hermetically sealed space isolated from the outside atmosphere.

Each holding member 20 has a plate-like base 35, a substantially conical support 36 which comes in point contact with the underside of the wafer W at its peripheral edge, and a post-like regulating portion 37 for regulating the end face of the wafer W, the support 36 and the regulating portion 37 being formed on the base 35.

The base 35 is provided at the underside thereof with a round shaft 38 in a unitary structure therewith. The round shaft 38 is rotatably attached to the upper cover 22 and the lower cover 23. Accordingly, each holding member 20 is rotatable around the perpendicular axis passing through the apex of the support 36.

A lever 41 substantially in an L shape in plan elevation is fixed, in a housing space 39 defined between the upper cover 22 and the lower cover 23, to the round shaft 38 formed at the underside of the base 35 of each holding member 20. One end of each lever 41 is rotatably connected to one end of a link 42. The other end of the link 42 is rotatably connected to the free end of a lever 43. The base end of the lever 43 is fixed to a rotary shaft 45 rotatably passing through the lower cover 23. Each link mechanism 40 including these levers 41, 43, the link 42 and the like, is housed in the housing space 39.

Further, another lever 46 is fixed to the underside of each rotary shaft 45. The tips of the levers 46 are rotatably connected, with pins 48, to a rotary ring 47 in an annular-plate shape in plan elevation. The tips of the levers 46 corresponding to the three holding members 20 are connected to the rotary ring 47 at circumferentially separated positions. The rotary ring 47 is rotatably displaceable in the circumferential direction while being guided by an annular guide groove 49 (See FIG. 3) formed in the underside of the lower cover 23.

Figure 4:
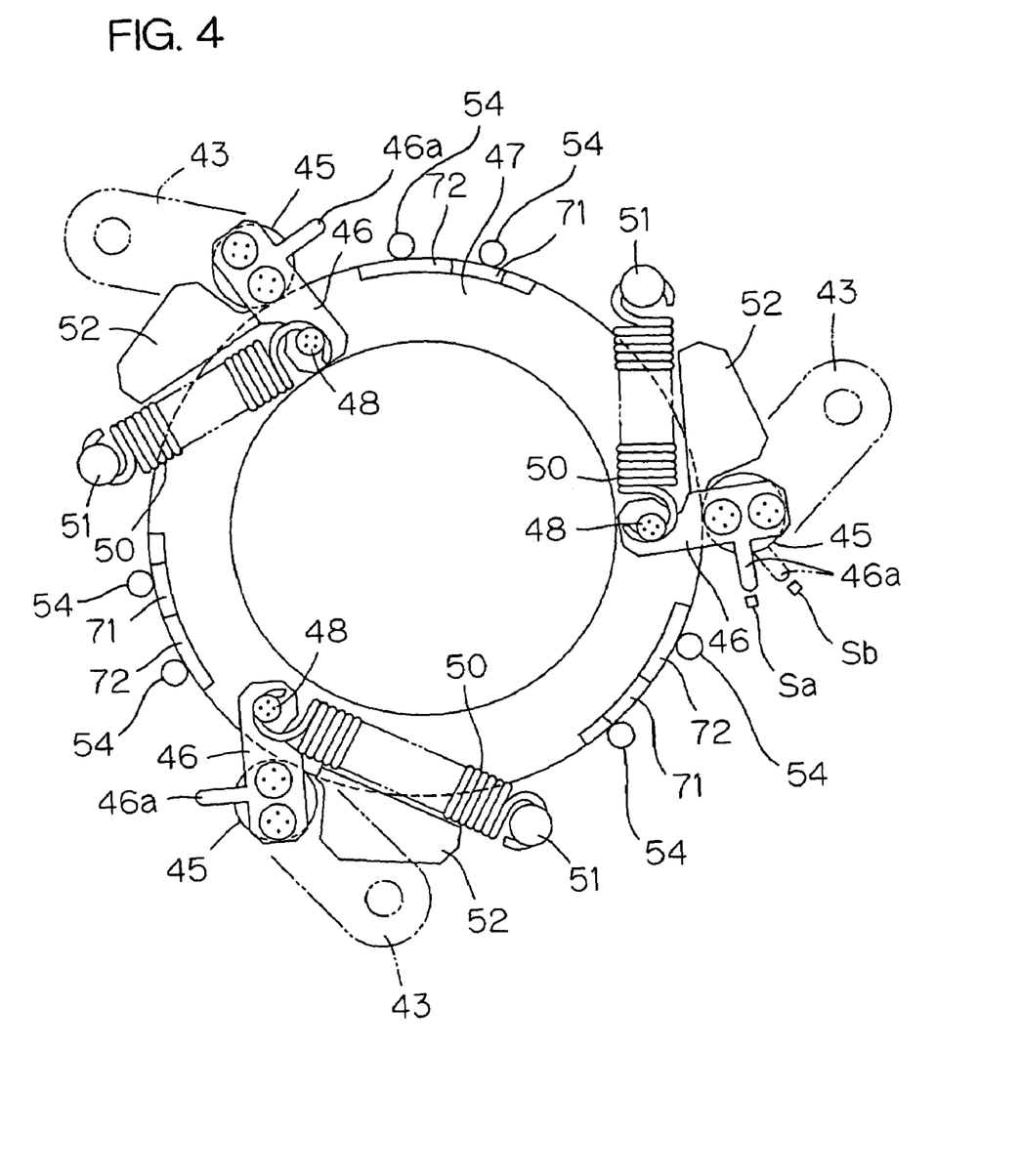
FIG. 4 is a bottom view for chiefly illustrating the arrangement in the vicinity of a rotary ring.

FIG. 4 is a bottom view for chiefly illustrating the arrangement in the vicinity of the rotary ring 47. One ends of three extension springs 50 are respectively hooked to three pins 48 extending from the underside of the rotary ring 47. The other ends of the extension springs 50 are respectively hooked to three spring hooking pins 51 extending from the underside of the lower cover 23. Accordingly, the levers 46 are biased clockwise in FIG. 4. This clockwise direction corresponds to the direction in which the holding members 20 are directed toward the end face of the wafer W. Further, the clockwise rotation of the levers 46 in FIG. 4 is regulated by stoppers 52. Accordingly, the regulating portions 37 of the holding members 20 regulate the end face of the wafer W at fixed positions.

To guide the rotation of the rotary ring 47, three pairs of bearings 54 in contact with the outer peripheral face of the rotary ring 47 are disposed between adjacent pins 48.

When the rotary ring 47 is rotated against the spring forces of the extension springs 50, the link mechanisms 40 are operated to interlock the three holding members 20 with one another, and the regulating portions 37 are retreated from the end face of the wafer W. At this time, each support 36 is located in the axis of rotation and maintains the state where the underside of the wafer W is supported. The lever 46 shown at the lower part in FIG. 4 is illustrated as having rotated the rotary ring 47. However, the three levers 46 around the rotary ring 47 are actually interlocked with one another by the rotary ring 47, and therefore brought into the substantially same state.

To detect the position of each lever 46, a horizontally projecting sector 46a is formed at the base end of each lever

46. Provision is made such that the position of one of the sectors 46*a* is detected by a sensor Sa, Sb when the rotation of the spin chuck 1 is stopped. More specifically, the sensor Sa detects one of the sectors 46*a* when the lever 46 comes in contact with the stopper 52 (where the wafer W is held), and the sensor Sb detects one of the sectors 46*a* when the lever 46 is separated from the stopper 52 (where the wafer W holding state is released). By such a position detection of a sector 46*a*, the state of the holding members 20 is detected.

When carrying in an untreated wafer W to the substrate processing apparatus or when carrying out a treated wafer W from the substrate processing apparatus, it is required to deliver the wafer W between the spin chuck 1 and a delivery robot (not shown). In such a case, the spin chuck 1 is stopped at a predetermined rotational position. At this time, the sector 46*a* of one of the three levers 46 is located immediately above the sensor Sa, Sb. Under such a condition, the rotation of both the rotary shaft 27 and the spin base 21 are regulated and the rotary ring 47 is rotated around the rotary shaft 27, by an arrangement to be discussed later. Then, the holding members 20 are rotated, and the regulating portions 37 are displaced from the holding positions where a wafer W can be held to the retreat positions where the regulating portion 37 are greatly retreated from the end face of the wafer W. Under such a condition, the delivery robot is to deliver the wafer W to or from the spin chuck 1.

As shown in FIG. 3, a substantially annular gear case 11 surrounding the rotary shaft 27 is attached, in the mechanism-unit housing space 10, to an upper lid 28*a* of the casing 28. As shown in a plan view of FIG. 5, a motor 60 is fixed onto the gear case 11.

Inside of the gear case 11, as shown in FIG. 3, a bearing 12 is press-fitted in the inner wall face at the outer periphery side of the gear case 11. The bearing 12 is coaxial with the rotary shaft 27. A ring-like gear 13 surrounding the rotary shaft 27 is fixed to the rotation-side ring of the bearing 12. This gear 13 has gear teeth at the inner periphery side. As shown in FIG. 6 which is a section view taken along the line VI-VI in FIG. 5, a pinion 14 fixed to the drive shaft of the motor 60 is meshed with the gear 13 in the gear case 11.

Figure 5:
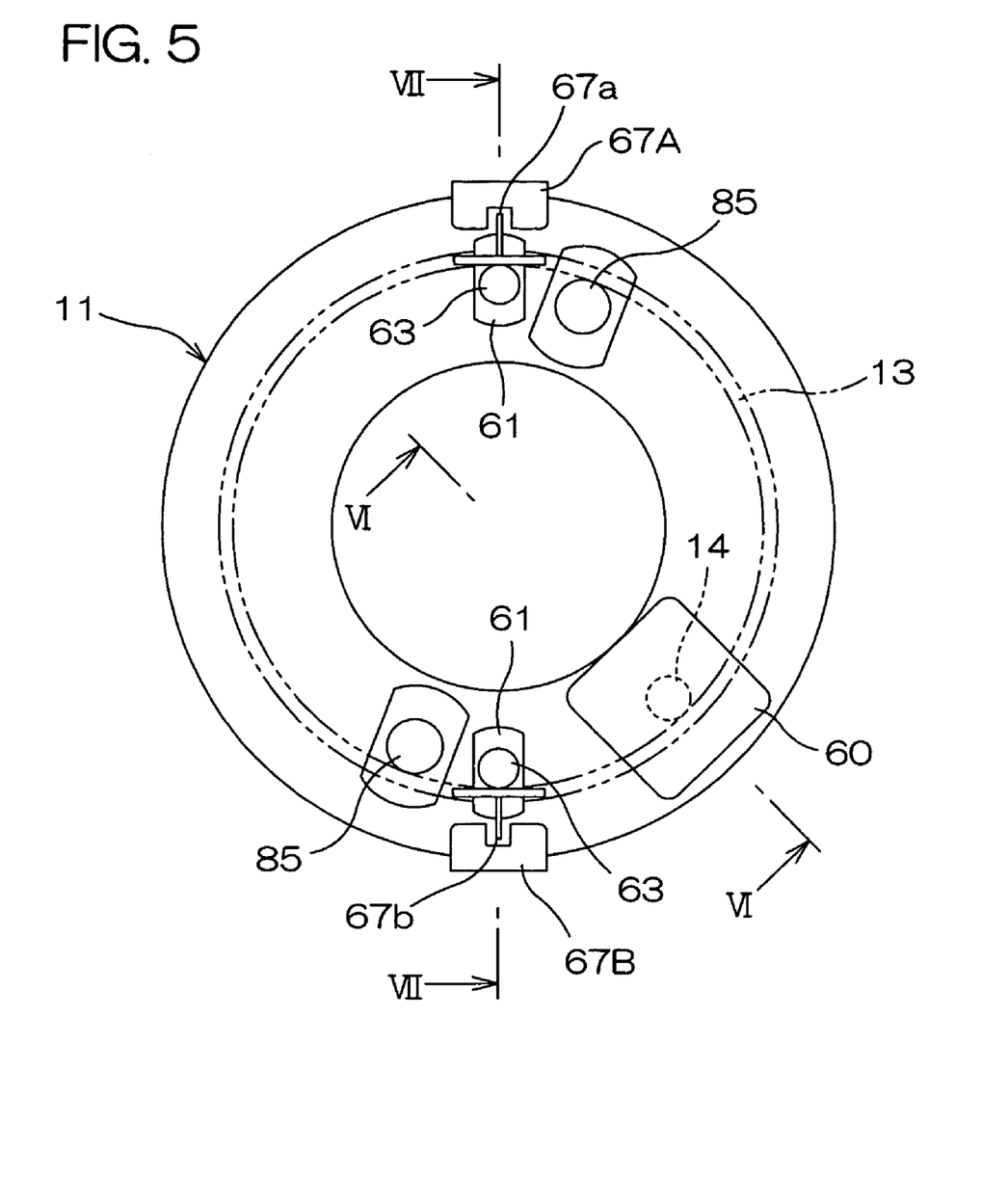
FIG. 5 is a plan view illustrating the arrangement for driving a moving member.
Figure 6:
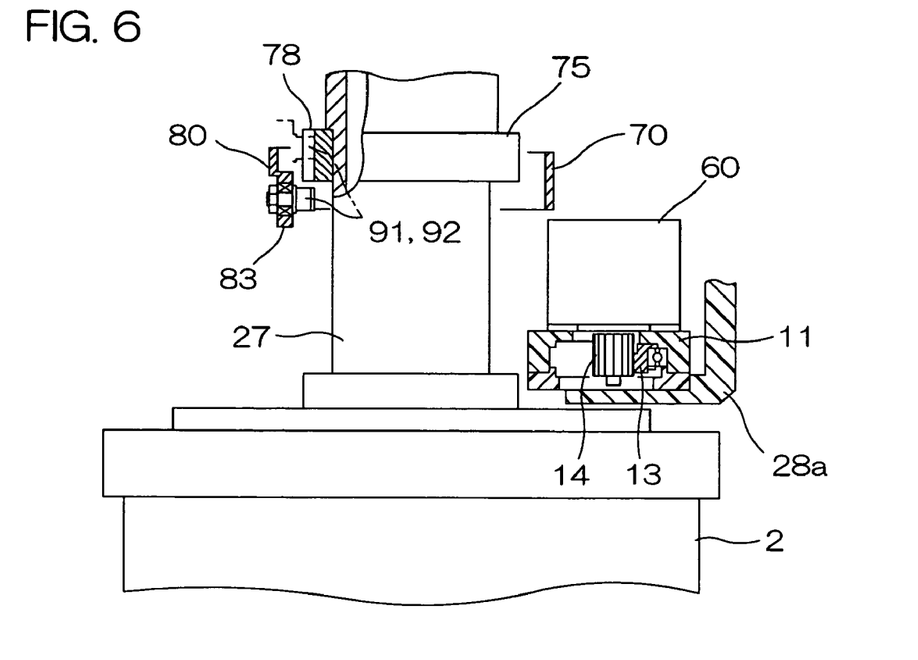
FIG. 6 is a section view taken along the line VI-VI in FIG. 5.
Figure 7:
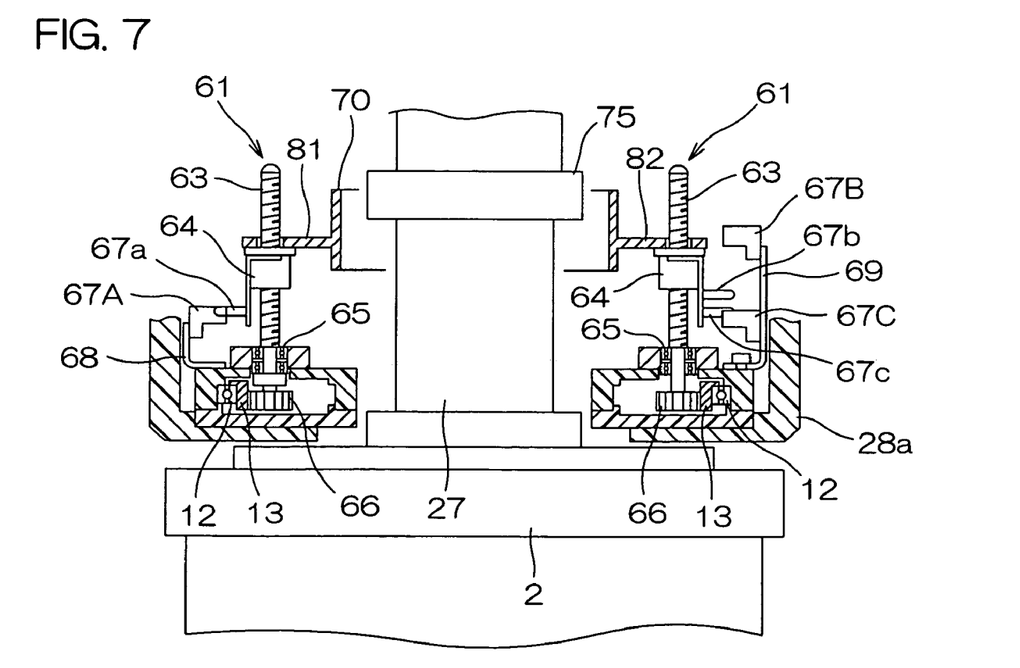
FIG. 7 is a section view taken along the line VII-VII in FIG. 5.

At positions separated from the motor 60 on the gear case 11, a pair of ball screw mechanisms 61 are disposed at positions opposite to each other with respect to the rotary shaft 27 (at opposite lateral sides of the rotary shaft 27), as shown in FIG. 5. As shown in FIG. 7 which is a section view taken along the line VII-VII in FIG. 5, each ball screw mechanism 61 has a threaded shaft 63 parallel to the rotary shaft 27, and a ball nut 64 threadedly connected to the threaded shaft 63. Each threaded shaft 63 is attached to the upper lid portion of the gear case 11 through a bearing 65, and the lower end of the threaded shaft 63 extends to the inside of the gear case 11. A pinion 66 is fixed to the lower end of each threaded shaft 63 and meshed with the gear 13.

Attached to the ball nuts 64 is a moving member 70 vertically movable, together with the ball nuts 64, along the rotary shaft 27. Accordingly, when the motor 60 is driven to rotate the pinion 14, the rotation thereof is transmitted to the gear 13. This rotates the pinion 66 meshed with the gear 13 to rotate the threaded shafts 63 of the ball screw mechanisms 61. This vertically moves, along the rotary shaft 27, the ball nuts 64 and the moving member 70 connected thereto.

Provision is made such that the vertical position of the moving member 70 is detected by position detecting units 67A, 67B, 67C. The position detecting unit 67A is attached to the gear case 11 through a sensor bracket 68, and is formed by a photo-interrupter arranged to detect a light shield provided by a light shield portion 67*a* fixed to the ball nut 64 of one ball screw mechanism 61. The position detecting units 67B, 67C are formed by photo-interrupters attached, through a sensor bracket 69, to the gear case 11 at its positions respectively different in height from each other. These position detecting units 67B, 67C are arranged to detect light shields provided by light shield portions 67*b*, 67*c* fixed to the ball nut 64 of the other ball screw mechanism 61.

Figure 8:
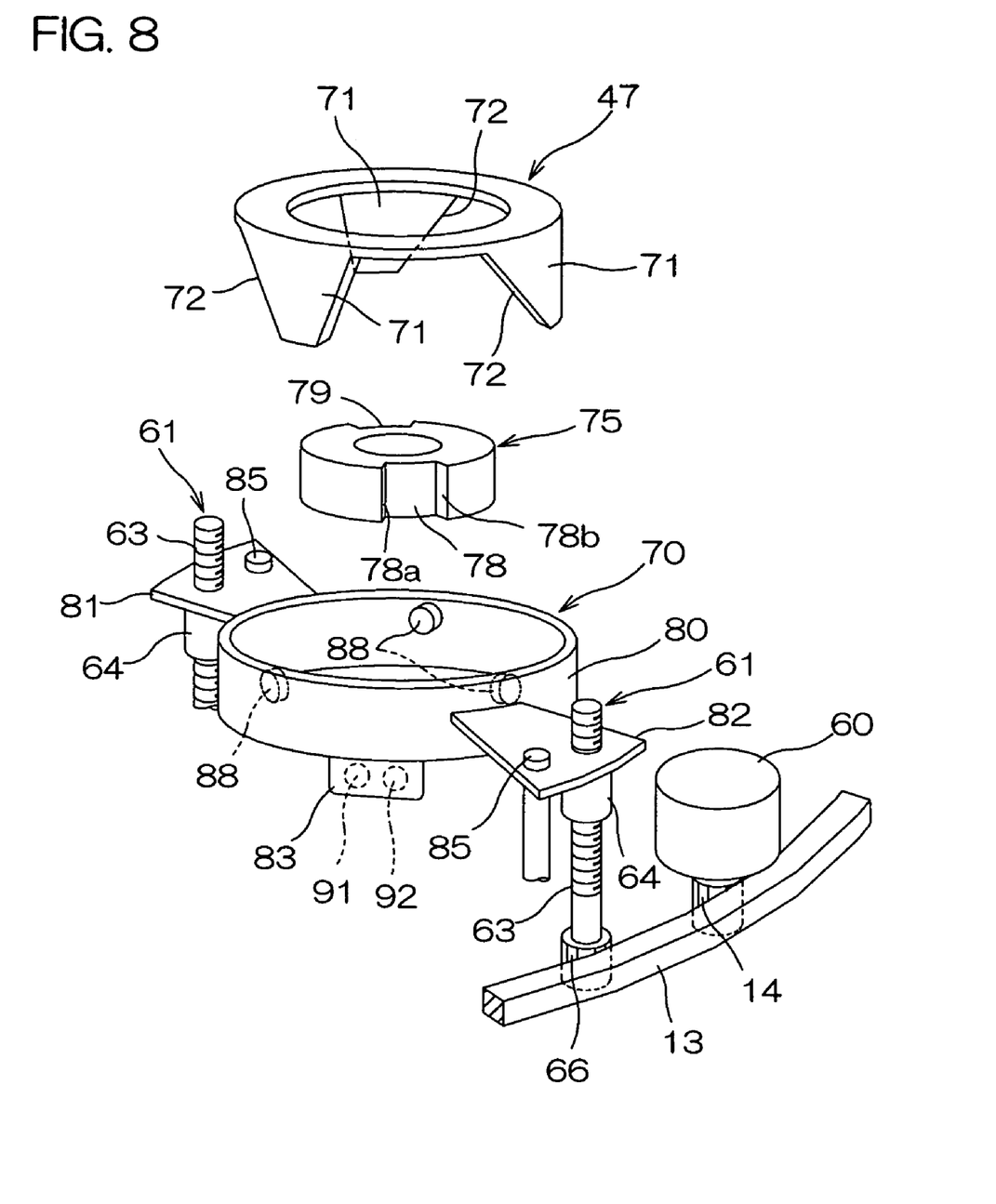
FIG. 8 is an exploded perspective view for illustrating the arrangement for displacing holding members between holding positions and retreat positions with the rotation of a spin base stopped.

FIG. 8 is an exploded perspective view for illustrating the arrangement for displacing the holding members 20 between the holding positions and the retreat positions with the rotation of the spin base 21 stopped. The rotary ring 47 is arranged to give a drive force simultaneously to the three link mechanisms 40 corresponding to the three holding members 20. A plurality of (three in this embodiment) cam members 71 are fixed, at substantially regular spatial intervals, to the rotary ring 47 at its underside peripheral edge portion. Each cam member 71 is made substantially in a reverse-trapezoid plate hanging down from the peripheral edge of the rotary ring 47, and has a cam face 72 inclined in the downward direction from the upper end of the cam member 71 toward one circumferential direction (toward the rotation direction of the rotary ring 47 when guiding the holding members 20 from the holding positions to the retreat positions). The cam members 71, the rotary ring 47 and the link mechanisms 40 form a drive force transmitting mechanism for transmitting the vertical movement of the moving member 70 to the holding members 20. Further, this drive force transmitting mechanism, the moving member 70, the motor 60 serving as a drive source, the ball screw mechanisms 61 and the like form a holding-member drive mechanism for driving the holding members 20 between the holding positions and the retreat positions.

As also shown in FIGS. 3, 6 and 7, an annular engaging member 75 shown under the rotary ring 47 in FIG. 8 is fixed to the rotary shaft 27. Actually, the annular engaging member 75 is attached to the rotary shaft 27 by fastening a pair of semicircular half-divided portions 75A, 75B with bolts 76, 77, causing the portions 75A, 75B to be made in an annular shape, as shown in a plan view in FIG. 9. The annular engaging member 75 has a pair of engagement concaves 78, 79 at positions symmetrical with respect to the rotary shaft 27. One engagement concave 78 is used for regulating the rotation of the rotary shaft 27. The other engagement concave 79 is formed to provide a symmetric weight distribution with respect to the rotary shaft 27.

Figure 9:
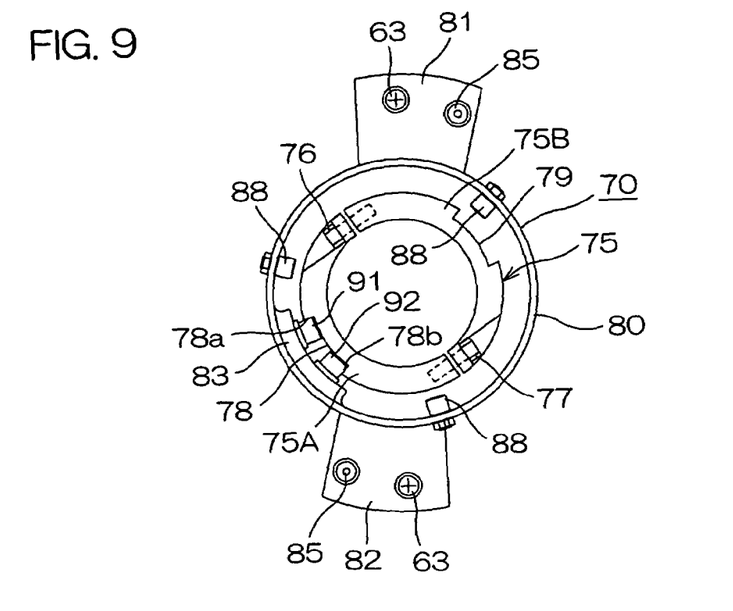
FIG. 9 is a plan view of the moving member and an annular engaging member.

The engagement concave 78 to be used for rotation regulation is a concave member extending along the rotary shaft 27 and having a rectangular section. The engagement concave 78 extends from the top of the annular engaging member 75 to the underside thereof, and is opened at its upper and lower ends. A pair of inner lateral faces of the engagement concave 78 serve as rotation regulating faces 78*a*, 78*b*.

In FIG. 8, the moving member 70 is illustrated below the annular engaging member 75. The moving member 70 has a cylindrical main body 80, a pair of plate-like projecting portions 81, 82 which project outwardly from the outer peripheral face of the main body 80, and a tongue piece 83 projecting downwardly from the main body 80. The projecting portions 81, 82 project symmetrically with respect to the rotary shaft 27 and extend substantially horizontally. The ball nut 64 and a guide shaft 85 are fixed to each of the projecting portions 81, 82. The threaded shafts 63 are threadedly connected to the ball nuts 64. Thus, the rotation of the motor 60 is transmitted to the threaded shafts 63 through the gear 13 to vertically move the moving member 70 together with the ball nuts 64. As shown in FIG. 3, the guide shafts 85 are guided vertically (in the direction parallel to the rotary shaft 27) by linear guides 86 fixed onto the top of the gear case 11. This securely vertically moves the moving member 70 along the rotary shaft 27.

As best shown in FIG. 9, three cam followers 88 are attached, at substantially regular spatial intervals, to the main body 80 in the vicinity of the upper edge thereof. These cam followers 88 are cam rollers which project inwardly from the inner peripheral face of the main body 80. These cam followers 88 are disposed at such positions as to respectively come in contact with the cam faces 72 of the three cam members 71 when the moving member 70 is upwardly moved.

As shown in FIGS. 6 and 9, the tongue piece 83 is fixed to the main body 80 as inwardly shifted (to the rotary shaft 27 side) from the inner peripheral face of the main body 80. A pair of locking cam followers 91, 92 are attached to the tongue piece 83 at positions substantially same in height. The cam followers 91, 92 are cam rollers which project inwardly (to the rotary shaft 27 side) from the inner peripheral face of the tongue piece 83. These cam followers 91, 92 are so disposed as to enter into the engagement concave 78 of the annular engaging member 75 when the moving member 70 is upwardly moved. The cam followers 91, 92 entering into the engagement concave 78 respectively come in contact with the rotation regulating faces 78a, 78b to regulate the rotation of the rotary shaft 27.

As discussed in the foregoing, the moving member 70, the cam followers 91, 92 attached thereto, the annular engaging member 75 engageable therewith, the motor 60 and the ball screw mechanisms 61 for driving the moving member 70, and the like form a rotation regulating mechanism for regulating the rotation of the spin base 21 and the rotation of the rotary shaft 27. More specifically, in this preferred embodiment, the holding-member drive mechanism and the rotation regulating mechanism commonly include the moving member 70, the ball screw mechanisms 61 and the like and are arranged to achieve their functions with a drive force given from the motor 60 as a common drive source.

When an untreated wafer W is carried in to the spin chuck 1, when a treated wafer W is carried out from the spin chuck 1, and when a treated wafer W is carried out from the spin chuck 1 and an untreated wafer W is then carried in to the spin chuck 1, the spin base 21 is stopped at a predetermined rotational stop position. This rotational stop position is a position where the three cam followers 88 attached to the moving member 70 are respectively positioned immediately below and opposite to the cam faces 72 of the three cam members 71 attached to the rotary ring 47, and where the locking cam followers 91, 92 are respectively positioned immediately below and opposite to the engagement concave 78 of the annular engaging member 75.

In this situation, when the motor 60 is rotationally driven in one direction, this rotation is transmitted to the threaded shafts 63 of the ball screw mechanisms 61 through the gear 13. This upwardly moves the moving member 70. In the course of this upward movement, the locking cam followers 91, 92 first enter into the engagement concave 78 from its lower opening end, and respectively come in contact with the rotation regulating faces 78a, 78b and then roll on their surfaces. At this point of time, the cam followers 88 do not come in contact with the cam faces 72. More specifically, the positional relationship among the locking cam followers 91, 92, the engagement concave 78, the cam followers 88 and the cam faces 72 is determined such that in the course of the upward movement of the moving member 70, the locking cam followers 91, 92 engage with the engagement concave 78 to regulate the rotation of the rotary shaft 27, before the cam followers 88 come in contact with the cam faces 72.

When the moving member 70 is further upwardly moved, the locking cam followers 91, 92 are upwardly moved while rolling on the rotation regulating faces 78a, 78b, and the cam followers 88 come in contact with the cam faces 72. When the moving member 70 is further upwardly moved from this situation, the upward motion of the moving member 70 is converted into a rotational motion in the release direction of the rotary ring 47 (counterclockwise direction in FIG. 2) under the action of the cam followers 88 and the cam members 71. Accordingly, the rotary ring 47 is rotated around the rotary shaft 27 against the spring force from the extension spring 50, and this rotation is transmitted to the holding members 20 through the link mechanisms 40. As a result, the holding members 20 are rotated in the release direction and displaced to the retreat positions retreated from the end face of the wafer W.

During this time, the locking cam followers 91, 92 are always positioned inside of the engagement concave 78 to regulate the rotation of the rotary shaft 27. Accordingly, a rotation reaction force which results mainly from the spring force of the extension spring 50 and which is applied to the spin base 21 and the rotary shaft 27 is received by the locking cam followers 91, 92 to securely prevent the rotary shaft 27 from being rotated. Accordingly, the rotation of the rotary ring 47 relative to the rotary shaft 27 is securely generated to displace the holding members 20 from the holding positions to the retreat positions.

In this situation, there is conducted a carrying-in of an untreated wafer W, a carrying-out of a treated wafer W, or a replacement of a treated wafer W with an untreated wafer W. Thereafter, when the motor 60 is driven in the reverse direction, the moving member 70 is downwardly moved. In the course of this downward movement, the rotary ring 47 is rotated in the holding direction (clockwise direction in FIG. 2) under the action of the extension spring 50 with the downward movement of the cam followers 88. Accordingly, the holding members 20 are displaced from the retreat positions to the holding positions.

In the course of the downward movement of the moving member 70, the locking cam followers 91, 92 downwardly get out of the engagement concave 78 from its lower end after the cam followers 88 have been separated from the cam faces 72. Accordingly, the engagement of the locking cam followers 91, 92 with the engagement concave 78 is held during the whole period of time during which the cam followers 88 come in contact with the cam faces 72 and which a rotation reaction force mainly resulting from the spring force of the extension spring 50 is applied to the spin base 21 and the rotary shaft 27.

The position detecting units 67A, 67B, 67C are arranged to detect the three height positions of the moving member 70. More specifically, the position detecting unit 67A detects the origin position of the moving member 70, the position detecting unit 67B detects an upper-side overrun position, and the position detecting unit 67C detects a lower-side overrun position. Accordingly, based on an output signal of the position detecting unit 67A, 67B, 67C, the moving member 70 can be reset to the origin position, or can be stopped in an emergency if the moving member 70 erroneously vertically overruns.

According to the preferred embodiment discussed in the foregoing, by driving the motor 60 to upwardly move the moving member 70, the rotation of both the spin base 21 and the rotary shaft 27 can be locked, and the rotary ring 47 can be then rotated to displace the holding members 20 from the holding positions to the retreat positions. Further, by driving the motor 60 to lower the moving member 70, the holding members 20 can be displaced from the retreat positions to the holding positions, and the rotation locking of both the spin base 21 and the rotary shaft 27 can be then released to allow them to be rotated. Thus, the rotation of the spin base 21 and the like can be regulated and allowed by a series of operations of driving the holding members 20, thus shortening the time required for carrying in/out a wafer W.

Further, the mechanism for regulating the rotation of the spin base 21 and the like is housed in the mechanism-unit housing space 10 under the spin base 21. It is therefore possible to release the holding of a wafer W by a very fast operation as compared with the case where a wafer holding state is released with the use of a release claw disposed outside of a processing cup.

Further, the moving member 70 and the mechanism for driving the moving member 70 are commonly used both for regulating the rotation of the spin base 21 and the like and for driving the holding members 20. This simplifies the arrangement, thus not only lowering the cost but also reducing the space required for the apparatus.

Figure 10:
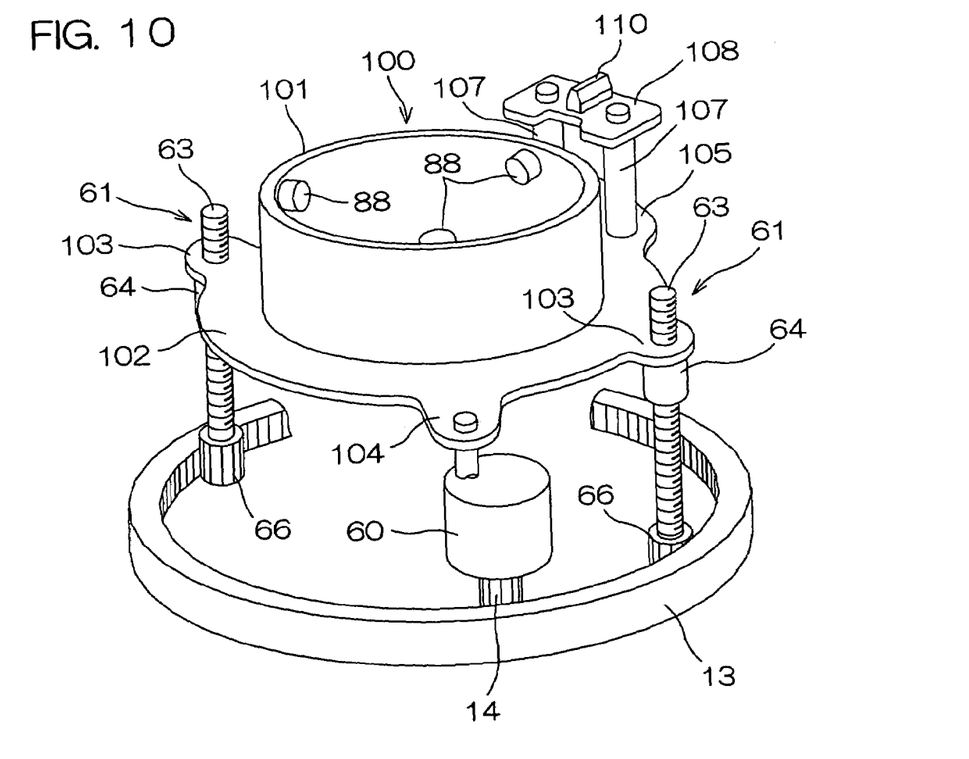
FIG. 10 is a schematic perspective view for illustrating the arrangement of a portion of a substrate processing apparatus to which a second preferred embodiment of the present invention is applied.
Figure 11:
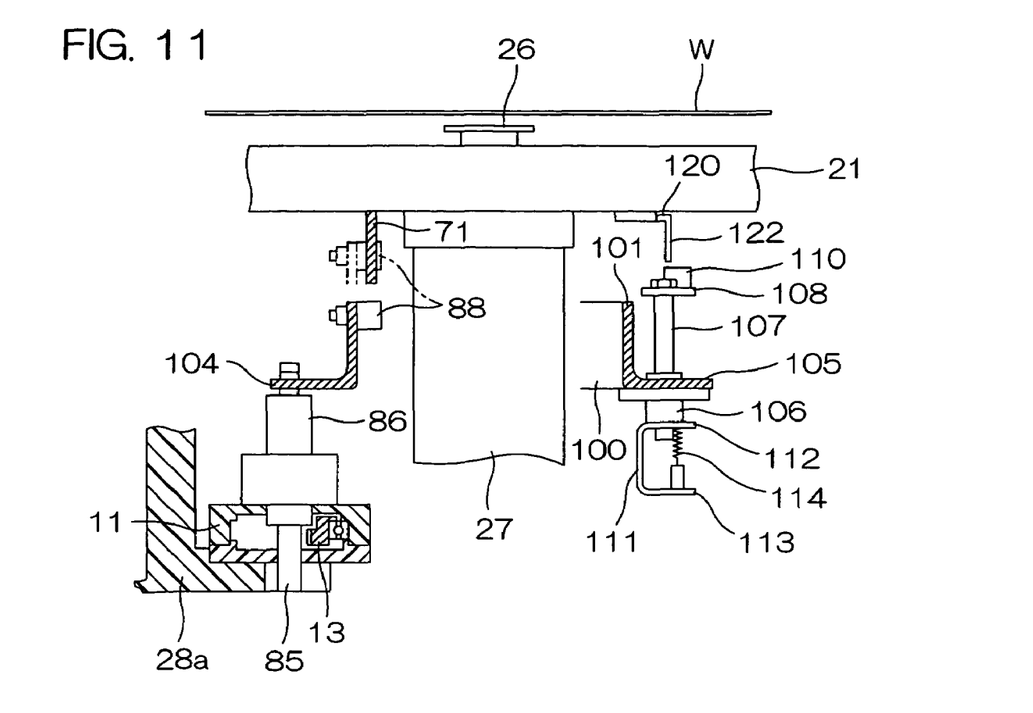
FIG. 11 is a schematic section view of a portion of the arrangement in FIG. 10.

FIG. 10 is a schematic perspective view for illustrating the arrangement of a portion of a substrate processing apparatus to which a second preferred embodiment of the present invention is applied. FIG. 11 is a schematic section view of a portion of the arrangement in FIG. 10. In FIGS. 10 and 11, like parts are generally designated by like reference numerals used in FIGS. 1 to 9. The following description will be made again referring to FIGS. 1 to 4.

The second preferred embodiment is different from the first preferred embodiment mainly in the arrangement of the rotation regulating mechanism for regulating the rotation of the spin base 21.

More specifically, the threaded shafts 63 of the ball screw mechanisms 61 to be rotated upon reception of a drive force transmitted through a gear 13 from a motor 60 are threadedly connected to ball nuts 64 fixed to a moving member 100. The moving member 100 has a substantially cylindrical main body 101 surrounding a rotary shaft 27, and a flange portion 102 outwardly extending from the lower end of the main body 101. Three cam followers 88 are attached to the main body 101 at its inner peripheral face in the vicinity of the upper edge thereof.

The flange portion 102 has a pair of projecting portions 103 at substantially symmetrical positions with respect to the rotary shaft 27. The ball nuts 64 are fixed to the projecting portions 103, and the threaded shafts 63 pass through the projecting portions 103.

Figure 12:
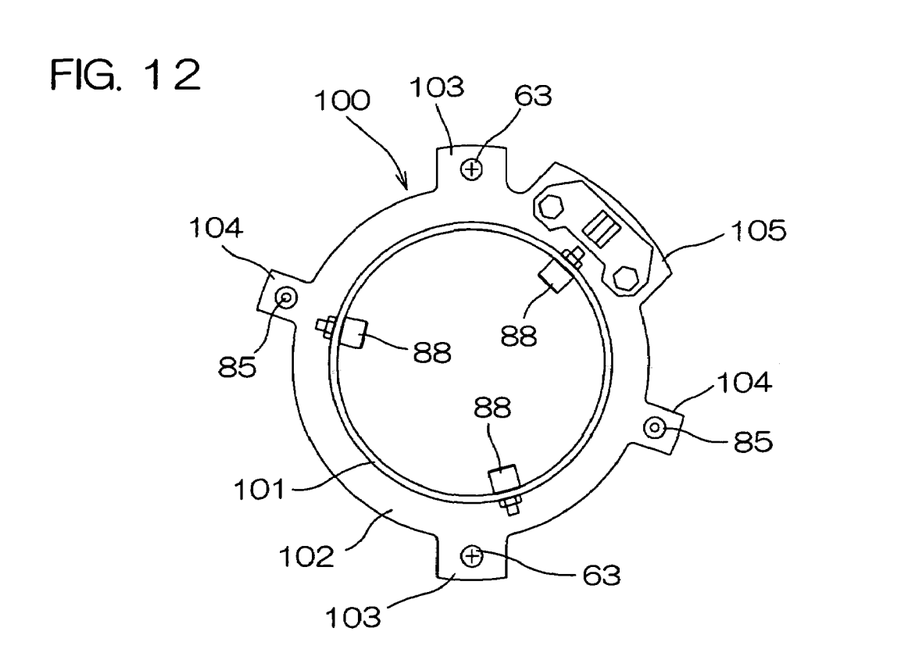
FIG. 12 is a plan view of a moving member of the second preferred embodiment.

As shown in a plan view in FIG. 12, the flange portion 102 has another pair of projecting portions 104, to which guide shafts 85 are fixed. The guide shafts 85 are vertically movable while being guided by linear guides 86 fixed to the gear case 11.

Figure 13:
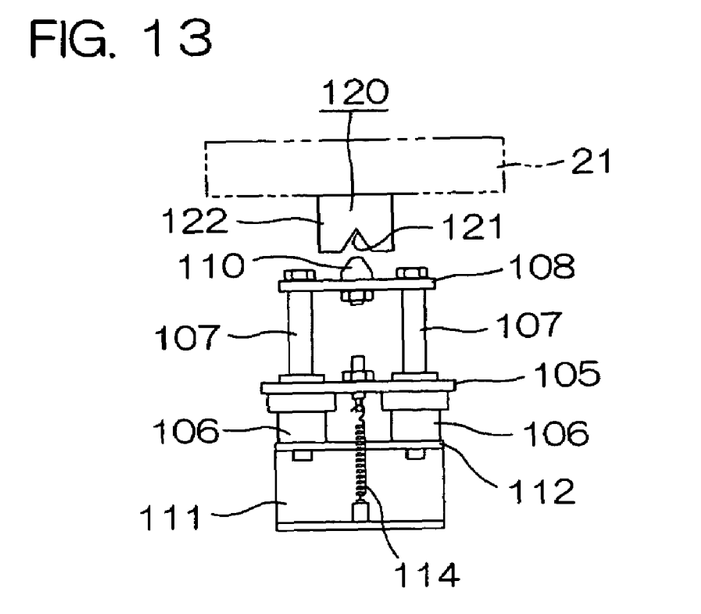
FIG. 13 is a view for illustrating the arrangement for regulating the rotation of a spin base.

The flange portion 102 has a further projection 105. This projection 105 is longer in the circumferential direction than other projecting portions 103, 104, and has a pair of linear guides 106 fixed to the underside of the projection 105 as shown in FIG. 13. A pair of guide shafts 107 are respectively inserted into the linear guides 106. An end plate 108 is disposed for connecting the upper ends of the pair of guide shafts 107. A wedge-like lock member 110 is attached to the top of the end plate 108 such that the ridge line of the wedge-like lock member 110 is directed in the turning radius direction of the rotary shaft 27.

On the other hand, the lower ends of the pair of guide shafts 107 are connected to each other by the upper plate portion 112 of a bracket 111 having a C-shape section in side elevation. The lower plate portion 113 of the bracket 111 is connected to the projection 105 of the flange portion 102 through an extension spring 114.

Secured to the underside of a spin base 21 is an engagement member 120 having an engagement concave 121 having an inverted-V shape section to be fitted to the lock member 110. This engagement member 120 is formed by a molded plate-like body having an L-shape section, and is disposed such that a hanging plate-like member 122 having the engagement concave 121 extends along the rotation-tangential direction of the spin base 21.

When the rotation of the spin base 21 is stopped for replacement of a wafer W on the spin chuck 1, the rotation stop position is controlled such that the engagement concave 121 of the engagement member 120 is located immediately above the lock member 110. At this time, the cam members 71 secured to the rotary ring 47 are positioned immediately above the cam followers 88.

When the motor 60 is driven in one direction, this drive force is transmitted to the threaded shafts 63 of the ball screw mechanisms 61 through the gear 13 to cause the moving member 100 to be upwardly moved. Accordingly, the lock member 110 is fitted in the engagement concave 121 of the engagement member 120 before the cam followers 88 come in contact with the cam faces 72 of the cam members 71. Thereafter, when the moving member 100 is further upwardly moved, the end plate 108, the guide shafts 107 and the bracket 111 remain stopped, and the moving member 100 and the linear guides 106 secured thereto are upwardly moved while causing the extension spring 114 to be stretched. While the engagement of the lock member 110 with the engagement concave 121 is maintained by the spring force of the extension spring 114, the cam followers 88 come in contact with the cam faces 72 to cause the rotary ring 47 coupled to the cam members 71 to be rotated around the rotary shaft 27. This drives the holding members 20 through the link mechanisms 40 to guide the holding members 20 from the holding positions to the retreat positions.

Upon completion of replacement of the wafer W, the motor 60 is reversely driven to cause the moving member 100 to start downwardly moving. In this process, the rotary ring 47 is rotated to the original position by the extension spring 50 (See FIG. 2) and the cam followers 88 are separated from the cam faces 72. Thereafter, the lock member 110 is disengaged from the engagement concave 121 to cause the spin base 21 to be rotatable.

According to the arrangement of this second preferred embodiment, too, there can be obtained effects similar to those produced by the first preferred embodiment mentioned earlier.

Figure 14:
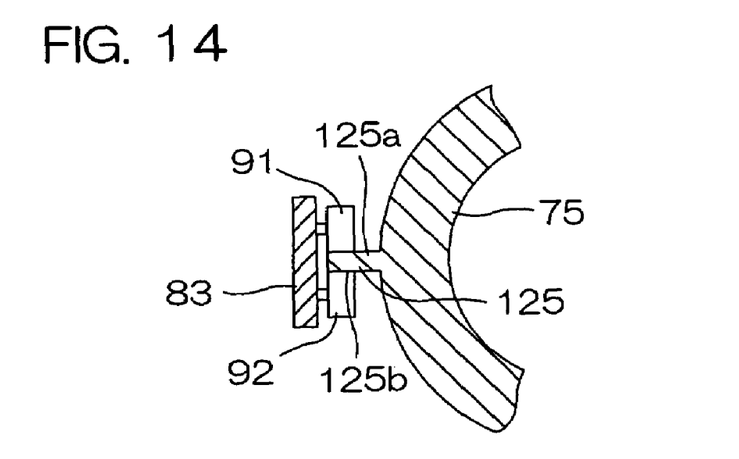
FIG. 14 is a schematic section view for illustrating another example of the arrangement for regulating the rotation of the spin base.

Preferred embodiments of the present invention have been discussed in the foregoing. However, the present invention may also be embodied in another mode. According to the first preferred embodiment, the pair of locking cam followers 91, 92 enter into the engagement concave 78 of the annular engaging member 75 to regulate the rotation of both the spin base 21 and the rotary shaft 27. However, such regulation may also be achieved by an arrangement shown in FIG. 14. More specifically, formed on the outer peripheral face of the annular engaging member 75 is a projecting member 125 which extends along the rotary shaft 27 and which has a substantially rectangular section. The projecting member 125 is held by and between the pair of locking cam followers 91, 92 to regulate the rotation of the rotary shaft 27. In this case, the pair of outer lateral faces of the projecting member 125 which respectively come in contact with the locking cam followers 91, 92 serve as rotation regulating faces 125*a*, 125*b*.

According to the second preferred embodiment, the wedge-like lock member 110 is disposed at the moving member 100, and the engagement member 120 having the engagement concave 121 is disposed at the spin base 21. However, a lock member having an engagement concave may be disposed at the moving member 100, and a wedge-like engagement member may be disposed at the spin base 21. More specifically, the shapes of the lock member and the engagement member may be reverse to those in the second preferred embodiment.

Embodiments of the present invention have been discussed in detail, but these embodiments are mere specific examples for clarifying the technical contents of the present invention. Therefore, the present invention should not be construed as limited to these specific examples. The spirit and scope of the present invention are limited only by the appended claims.

This Application corresponds to Japanese Patent Application No. 2004-267332 filed with the Japan Patent Office on 14 Sep. 2004, the full disclosure of which is incorporated herein by reference.

What is claimed is:

1. A substrate holding and rotating apparatus for holding and rotating a substrate, comprising:
    a spin base connected to a rotary shaft and rotatable therearound;
    holding members attached to the spin base and displaceable between holding positions at which the holding members come in contact with a peripheral edge of the substrate such that the holding members are capable of holding the substrate, and retreat positions at which the holding members are retreated from the holding positions;
    a holding-member drive mechanism for driving the holding members between the holding positions and the retreat positions; and
    a rotation regulating mechanism arranged to be brought, in association with an operation of the holding-member drive mechanism, into a rotation allowing state where the spin base is allowed to be rotated and into a rotation regulating state where the rotation of the spin base is regulated; wherein
    the holding-member drive mechanism includes: a drive source; a moving member arranged to be moved upon reception of a drive force from the drive source; and a drive force transmitting mechanism for transmitting the motion of the moving member to the holding members, and
    the rotation regulating mechanism includes an engagement portion provided on the rotary shaft or the spin base; and a lock member provided on the moving member, the lock member being arranged to be brought into an engagement state where the lock member is engaged with the engagement portion by the movement of the moving member and into a disengagement state where the lock member is disengaged from the engagement portion.

2. A substrate holding and rotating apparatus according to claim 1, wherein
    the moving member is movable along the rotary shaft and has a cam follower for transmitting a drive force to the holding-member drive mechanism, and
    the drive force transmitting mechanism includes:
    a rotary ring attached to the spin base and rotatable around the rotary shaft with respect to the spin base;
    link mechanisms for transmitting the rotation of the rotary ring to the holding members; and
    a cam member secured to the rotary ring for receiving the cam follower to convert the drive force transmitted therefrom into the rotation of the rotary ring.

3. A substrate holding and rotating apparatus according to claim 1, wherein the rotation regulating mechanism is arranged to be brought into the rotation regulating state from the rotation allowing state before the holding members are driven when the holding members are driven from the holding positions to the retreat positions by the holding-member drive mechanism, and is also arranged to be brought into the rotation allowing state from the rotation regulating state after the driving of the holding members has been completed when the holding members are driven from the retreat positions to the holding positions by the holding-member drive mechanism.

* * * * *